United States Patent [19]

Hill et al.

[11] Patent Number: 4,502,021
[45] Date of Patent: Feb. 26, 1985

[54] CONSTANT BANDWIDTH AUTOMATIC GAIN CONTROL SYSTEM

[75] Inventors: John P. Hill, Broomfield; James J. Touchton, Boulder, both of Colo.

[73] Assignee: Storage Technology Corporation, Louisville, Colo.

[21] Appl. No.: 481,084

[22] Filed: Mar. 31, 1983

[51] Int. Cl.³ .............................................. H03G 3/10
[52] U.S. Cl. ..................................... 330/279; 330/284
[58] Field of Search ............... 330/129, 254, 279, 284; 360/77, 78

[56] References Cited

U.S. PATENT DOCUMENTS 3,581,222  5/1971  Dunwoodie ........................ 330/284
3,757,240  9/1973  Fogg .............................. 330/284 X Primary Examiner—James B. Mullins
Assistant Examiner—Steven J. Mottola
Attorney, Agent, or Firm—Bryant R. Gold

[57] ABSTRACT

A constant bandwidth automatic gain control (AGC) system is presented. The system is especially suitable for use in the positioning servo system of a magnetic disk storage system. The system includes a double balanced modulator circuit and a fixed gain video amplifier circuit. The double balanced modulator circuit functions as a variable gain element, and the gain thereof is set by a control voltage derived from an otherwise conventional AGC loop. The gain of the current steering stage of the double balanced modulator is limited to values no greater than 0.5.

11 Claims, 5 Drawing Figures

CONSTANT BANDWIDTH AUTOMATIC GAIN CONTROL SYSTEM

BACKGROUND OF THE INVENTION

This invention relates to constant bandwidth automatic gain control systems. More particularly, the invention relates to a simple, inexpensive constant bandwidth automatic gain control system for use in a servo system controlling the position of the read/write head of a rotatable magnetic disk storage system.

In a magnetic information storage system, magnetic media (on which information has been previously stored in the form of selectively magnetized particles) moves relative to a magnetic read head. Movement of the media past the read head may be realized by linearly moving a tape past a stationary head (a tape storage system), or by rotating a magnetic disk past a read head that is radially positioned with respect to the rotating disk so that selective tracks or bands on the disk can be accessed (a disk storage system). Each of the selectively magnetized particles on the media have a magnetic flux associated therewith. The movement of the magnetic flux past the read head induces a voltage therein representative of the magnetically stored information. This induced voltage is then amplified in order to generate a read signal of sufficient amplitude to be useful for correctly interpreting the stored information.

Unfortunately, the voltage induced in the read head may vary a great deal in amplitude. This amplitude variation may be caused by numerous factors, such as variations in the distance between the head and the media, the relative speed at which the media passes the head, impurities or other imperfections in the media or head, and the like. Such variations in amplitude, if not eliminated, can cause significant errors in the proper interpretation of the stored information. The problem is especially acute in a magnetic disk storage system, wherein servo bands are pre-recorded on a disk surface in order to position the read head at the correct radial position on the disk. In such a system, any variations in the amplitude of the induced servo positioning signal(s) may translate directly into positioning errors of the head. Therefore, some means must be used for maintaining the amplitude of the sensed signal at a constant level or amplitude even when the voltage induced in the read head may significantly vary in amplitude.

Automatic gain control (AGC) systems are well known in the art for maintaining an output signal at a constant amplitude regardless of variations in the input signal amplitude. See, e.g., Markus, *Modern Electronic Circuits Reference Manual,* Chapter 6 (Automatic Gain Control Circuits), McGraw-Hill Book Company (1980). Such systems, which are used for a wide variety of applications, typically include a variable gain element that controls the amplification of the amplitude-varying input signal so that the output signal maintains an amplitude that is more or less constant. These AGC systems are often realized by comparing the amplitude of the output signal to a reference signal, generating an error signal representing the difference between the output signal and the reference signal, and then using the error signal as a control signal to control the gain of the variable gain element. This gain is selected such that the input signal is amplified by a gain factor that yields an output signal of the desired amplitude.

While such AGC systems maintain a constant amplitude output signal, they unfortunately also exhibit a varying loop bandwidth. The loop bandwidth of an AGC system relates to how quickly or how slowly the system responds to a change in the input signal. If the bandwidth is too small, the system may respond much too slowly to a change in input signal level to satisfy the requirements of the desired application. If, on the other hand, the bandwidth is too large, the system response will not be properly optimized for disk defect immunity and stability requirements. For servo positioning applications, where the response time must be carefully selected, and where a stable system is required, the selecting and maintaining of a desired bandwidth is thus critically important.

Attempts have been made in the art, with various degrees of success, to provide a constant bandwidth AGC system. U.S. Pat. Nos. 3,684,974 and 4,326,226, are representative of such attempts. However, all such constant bandwidth AGC systems known to applicants are either ineffective for disk storage systems (that is, they don't achieve the needed gain at the needed bandwidth for a particular application), or their implementation requires rather sophisticated circuitry.

SUMMARY OF THE INVENTION

It is an object of the present invention to provide an improved AGC system that maintains a relatively constant AGC loop bandwidth independent of input signal level.

It is a further object of the present invention to provide such a constant bandwidth AGC system that may be realized with readily available components, and which is easy to build, test, and maintain.

It is still a further object of the present invention to provide a constant bandwidth AGC system that may be used in the servo system of a magnetic disk storage system.

The above and other objects of the present invention are realized with an AGC system that may be realized with only a few off-the-shelf components, including at least two commercially available integrated circuits. Advantageously, no large scale integration (LSI) circuits are required, although the system could be realized in LSI if desired.

Included in the AGC system of the present invention is a variable gain element that multiplies an input signal, $e_{IN}$, by a variable gain factor, b, in order to produce an output signal, $e_{OUT}$, that is equal to the product of b and $e_{IN}$. The gain factor b is set by a control voltage which is derived from a feedback loop using conventional AGC techniques.

In order to maintain a substantially constant bandwidth in the AGC system of the present invention, the derivative of the gain factor b with respect to the control voltage, b', is varied inversely proportional to $e_{IN}$ so that the product $b'e_{IN}$ (which product is directly proportional to the AGC loop bandwidth) remains relatively constant. In addition, the gain of the variable gain element is restricted to values that are no greater than 0.5.

In one embodiment of the invention, the variable gain element of the AGC loop is realized with a commercially available double balanced modulator integrated circuit. The output of the double balanced modulator is amplified in a fixed gain video amplifier, also realizable using a commercially available integrated circuit. A conventional demodulator, summing network, reference signal generator, and error amplifier may be used with the double balanced modulator and video amplifier in order to complete the AGC loop. The gain of the double balanced modulator is set by a control voltage produced by the error amplifier. The gain of the double balanced modulator is limited to 0.5 or less by using the control voltage to steer at least one half of a bias current, modulated by the input signal $e_{IN}$, to ground. For the particular embodiment disclosed, such a gain limitation includes forcing the control voltage to assume only negative values with respect to its voltage reference. Advantageously, by limiting the gain to 0.5 or less, the gain of the balanced modulator as a function of the control voltage assumes a shape that forces the loop bandwidth to be relatively constant.

BRIEF DESCRIPTION OF THE DRAWINGS

The above and other objects, features, and advantages of the present invention will be more apparent from the following more particular description thereof presented in connection with the following drawings, wherein.

DETAILED DESCRIPTION OF THE INVENTION

The present invention relates to an improved constant bandwidth AGC system that may be used for a wide variety of applications. In the preferred embodiment, the invention is used as part of the servo system of a magnetic disk storage system. Such systems recover magnetically stored information from one or more rotating magnetic disks by selectively positioning a read/write head radially with respect to the disk. Magnetic disk storage systems may include a plurality of magnetic disks stacked so as to rotate about a common axis or spindle. A more thorough discussion of such magnetic disk storage systems, including a discussion of the servo systems used by such systems, may be found in the previously cited U.S. Pat. No. 4,326,226, which patent is incorporated by reference herein.

Figure 1:
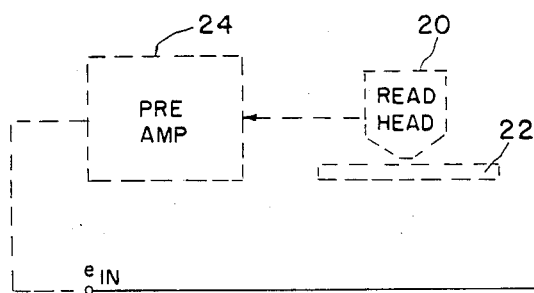
FIG. 1 is a block diagram of a constant bandwidth AGC system in accordance with the present invention.
Figure 1:
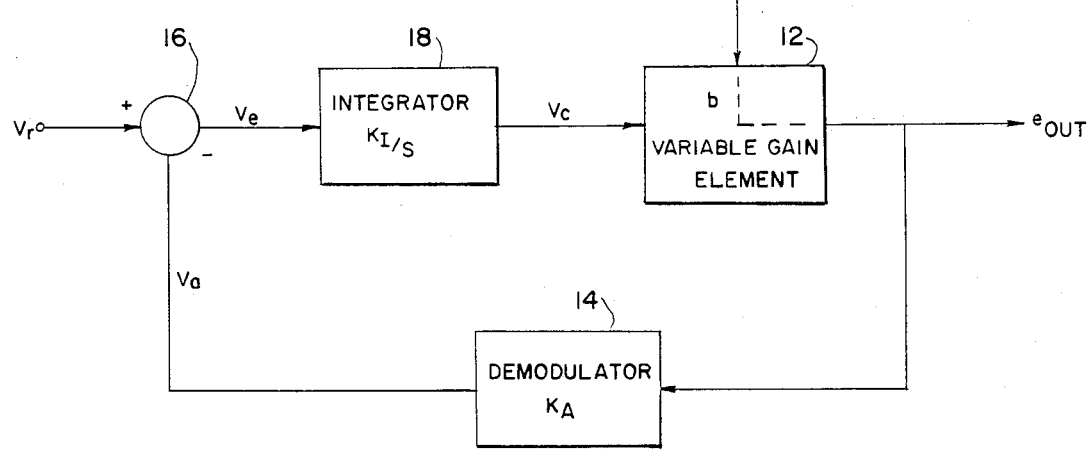

Referring to FIG. 1, there is shown a block diagram of an AGC system according to the present invention. It should be noted that the block diagram in FIG. 1 represents an AC analysis of the system. An input signal $e_{IN}$ is applied to a variable gain element 12. The output of the variable gain element 12 is a signal identified as $e_{OUT}$. The gain of the variable gain element is represented by the factor b. Thus, $e_{OUT}$ is a function of $e_{IN}$ and b and may be mathematically expressed as:

$$e_{OUT} = b e_{IN}. \tag{1}$$

The output signal is coupled to a demodulator 14 having a gain $K_A$. The output of the demodulator 14, $v_a$, is then compared to a reference voltage, $v_r$, in a summing network 16. The polarities of the signals applied to the summing network 16 are selected so that the output $v_e$ represents the error or difference between $v_r$ and $v_a$. This error signal $v_e$ is applied as the input to an error amplifier or integrator circuit 18. The output of the integrator circuit 18 is a control voltage $v_c$ that is applied to the variable gain element 12. As will be explained more fully below, the control voltage $v_c$ sets the gain b of the variable gain element 12.

For a magnetic disk storage application, the input signal $e_{IN}$ will typically be obtained from a read head 20 that is selectively positioned with respect to rotating magnetic media 22. As explained previously, the magnetized particles included on the surface of the media 22 induce a voltage in the read head 20 that is amplified in a preamplifier 24 and presented as the input signal $e_{IN}$ to the AGC system of the present invention.

In operation, the input signal $e_{IN}$ will vary in amplitude. But for the AGC system used, these changes in amplitude would be reflected in the output signal $e_{OUT}$. To illustrate how the AGC system operates, assume that $e_{IN}$ increases in amplitude. Normally, this increase in input voltage would cause the output voltage $e_{OUT}$ to also increase in amplitude. However, as soon as $e_{OUT}$ attempts to increase, the error voltage $v_e$ will also increase because $v_a$ increases to reflect the increase of $e_{OUT}$. The error voltage, $v_e$, after being integrated in the integrator 18 (which integrator effectively averages the error voltage over time), is converted to the control voltage $v_c$, which signal sets the gain b of the variable gain element 12. Because the gain factor b varies inversely proportional to the input signal $e_{IN}$, an increase in $e_{IN}$ decreases the gain factor b, thereby reducing $e_{OUT}$ to a desired value.

The operation of the AGC loop shown in FIG. 1 can, of course, be described more precisely in the mathematical terms as follows. The gain factor b is a function of the control voltage or $$b = f(v_c). \tag{2}$$

More specifically, b can be expressed as $$b = b' v_c \tag{3}$$

where b' is the derivative of the gain element b with respect to the control voltage $v_c$, and may be expressed as $$b' = db/dc. \tag{4}$$

Substituting equation 3 into equation 1 yields $$e_{OUT} = b' v_c e_{IN}. \tag{5}$$

From FIG. 1, it can be seen that $$v_c = (K_I v_e)/s. \tag{6}$$

Thus, by substituting equation 6 into equation 5 it is seen that $e_{OUT}$ may be expressed as $$e_{OUT} = (b' K_I v_e e_{IN})/s. \tag{7}$$

The ratio of the output voltage $e_{OUT}$ to the error voltage $v_e$ may thus be expressed as $$e_{OUT}/v_e = (b' k_I e_{IN})/s. \tag{8}$$

Using conventional closed-loop analysis techniques, it is seen that equation 8 represents the forward transfer function, G(s), while the demodulator gain $K_A$ represents the feedback transfer function H(s), of a classical closed loop system. That is $$e_{OUT}/v_c = G(s) \tag{9}$$

and $$K_A = H(s). \tag{10}$$

The transfer function for such a closed loop system, T(s), may be expressed as $$T(s) = G(s)/(1 + G(s)H(s)). \tag{11}$$

Substituting in the appropriate values for G(s) and H(s), equation 11 reduces to $$T(s) = \frac{1}{K_A} \left[ \frac{1}{s\left(\frac{1}{b'e_{IN}K_IK_A}\right) + 1} \right] \tag{12}$$

which is of the form of $$T(s) = K \left[ \frac{1}{s(1/\omega) + 1} \right]. \tag{13}$$

From equations 12 and 13 it is seen that the closed loop bandwidth, BW, of the AGC system of FIG. 1 may be expressed as $$BW = \omega/2\pi = (b'e_{IN}K_IK_A)/2\pi. \tag{14}$$

Equation 14 reveals that the bandwidth, BW, varies as a function of b' and $e_{IN}$. The remaining parameters included in equation 14 ($K_I$, $K_A$ and $2 0\pi$) are constants. Thus, the key to maintaining the bandwidth constant is to control b' such that the product (b')($e_{IN}$) is also a constant. How this desired result is achieved through the present invention is explained more fully below.

Figure 2:
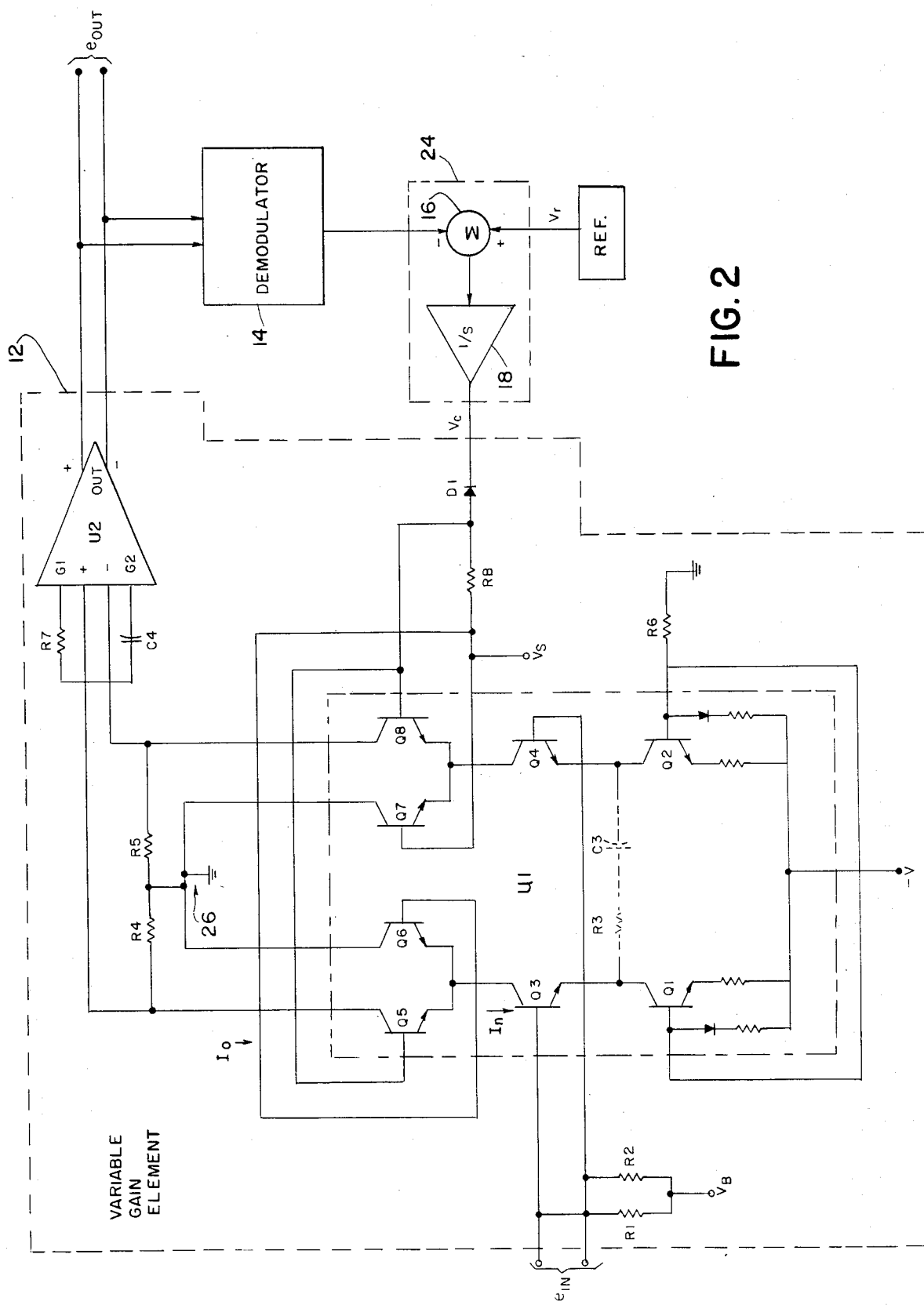
FIG. 2 is a schematic diagram of the system of FIG. 1.

Referring next to FIG. 2, there is shown a schematic diagram of the system of FIG. 1. The demodulator 14, summing node 16, and integrater 18 are shown in FIG. 2 as blocks which are known in the art and do not form key parts of the present invention. It is noted, however, that the demodulator 14 could be any of numerous types, such as a peak detector demodulator or an area detector demodulator. A representative demodulator that could be used is disclosed in applicants' copending patent application Ser. No. 447,823, titled "Low Offset Position Demodulator", filed 12-08-82. Typically, the summing node 16 and the integrator 18 may be realized in a single integrated circuit 24, such as a conventional operational amplifier configured as an integrator, as can be readily done by those skilled in the art.

The variable gain element 12 is shown in FIG. 2 as comprising two integrated circuits U1 and U2. U1 is a double balanced modulator, such as the TCA240 integrated circuit manufactured by Philips. U2 is a fixed gain, AC differential, video amplifier, and may be realized with an NE592 integrated circuit manufactured by Signetics. U2 is used as a high common mode rejection, buffered, gain stage.

Referring to the schematic of U1 in FIG. 2, the input signal $e_{IN}$ is converted into a differential current signal riding on a bias current. The bias current is set by the lower transistors Q1 and Q2, and the value thereof is controlled or set by the external resistor R6 in combination with the supply voltage $-V$. The input signal $e_{IN}$ modulates the bias current as it flows through transistors Q3 and Q4. External compensation, comprising resistor R3 and capacitor C3, may be added to the integrated circuit U1 as needed. The upper four transistors—Q5, Q6, Q7, and Q8—steer the total differential current either to ground, at 26, or to the collector resistors R4 and R5. If all of the differential current is steered to ground (Q6 and Q7 fully on, Q5 and Q8 off), then there is no output signal. If, on the other hand, all of the differential current is steered to the collector resistors (Q5 and Q8 on, and Q6 and Q7 off) then a maximum output signal is generated across the collector resistors. In the preferred embodiment, the maximum gain requested by U1 is one half of the maximum gain possible. This is achieved by limiting the voltage applied to the bases of transistors Q5 and Q8 to a value that never exceeds the voltage applied to the bases of Q6 and Q7. As will be explained below, this action forces the shape of the gain curve associated with U1 to be that which is required in order to realize the desired constant loop bandwidth operation.

The differential signal developed by the current flowing through the collector resistors R4 and R5 is amplified and buffered by the fixed gain amplifier U2. The common mode rejection of U2 is used to remove the common mode voltage developed across R4 and R5. Thus, the output of the amplifier U2, $e_{OUT}$, has the common mode voltage removed therefrom.

The output of the summing node and integrating circuit 24 is used as the control voltage $v_C$. This voltage controls the gain of the double balanced modulator U1. The control voltage $v_c$ is applied across the resistor R8. A reference voltage $v_s$ is applied to one end of R8 in order to bias the transistors Q6 and Q7 at the desired level. The diode D1 is used to limit the control voltage to negative values. For this particular embodiment, negative values of $v_c$ limit the gain of the stage to one half of the maximum gain under all conditions. That is, by using D1 as shown, the voltage applied to the bases of transistors Q5 and Q8 will never exceed the bias voltage applied to the bases of transistors Q6 and Q7. This is also or alternatively accomplished by the gain selection of U1 and U2.

An analysis of the double balanced modulator circuit U1 shows that the gain of the current steering stage (Q5, Q6, Q7, and Q8) thereof may be expressed as $$b = \frac{I_O}{I_{IN}} \cong \frac{\exp(v_c/V_T)}{1 + \exp(v_c/V_T)} \tag{15}$$

where $I_O$ is the output current, $I_{IN}$ is the input current, (see FIG. 2), $v_c$ is the control voltage, and $V_T$ is the thermal voltage (a known value for a given semiconductor material and temperature). Thus, equation 15 describes how the gain b varies as a function of the control voltage $v_c$. As derived earlier, and as shown in equation 14, the bandwidth of the AGC loop is a function of the derivative of the gain b'. The derivative b' may be determined from equation (15) as $$b' = \frac{1}{V_T} \left[ \frac{\exp(v_c/V_T)}{1 + \exp(v_c/V_T))^2} \right]. \tag{16}$$

Figure 3A:
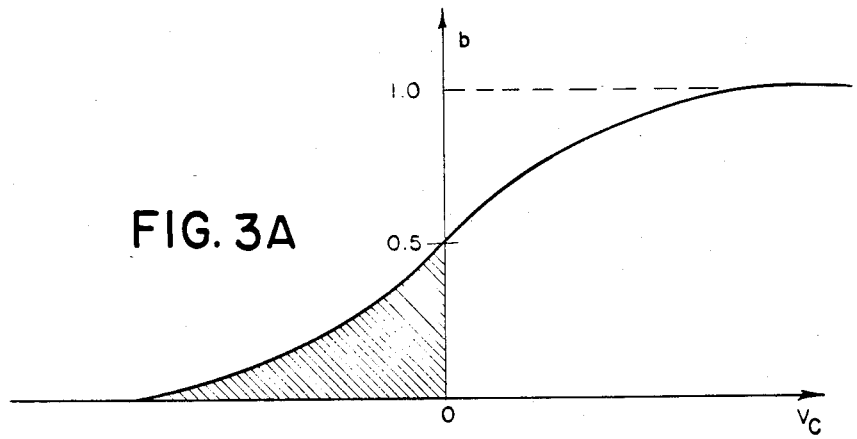
FIGS. 3A and 3B are graphs illustrating how the gain b (FIG. 3A) and the derivative of the gain b' (FIG. 3B) of the variable gain element vary as a function of the control voltage $v_c$.
Figure 3B:
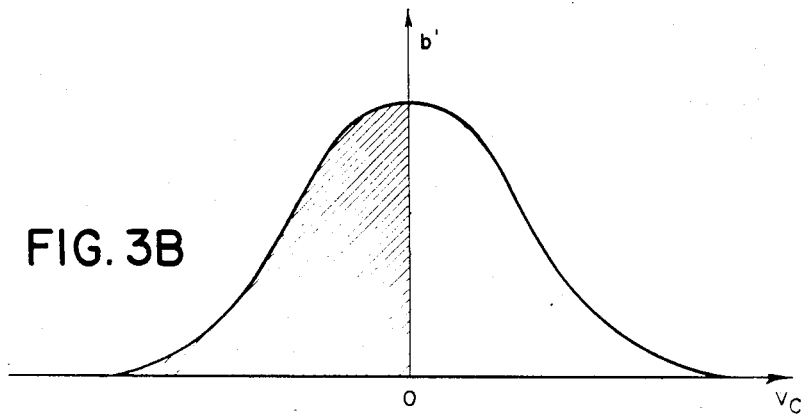

The gain b as expressed in equation 15 and the derivative of the gain, as expressed in equation 16, are plotted as a function of the control voltage in FIGS. 3A and 3B respectively. By operating in the shaded region of FIG. 3B, a desired relationship is maintained between the derivative b' and the control voltage $v_c$. Operating in this shaded region of FIG. 3B is achieved by limiting the gain to the shaded area of FIG. 3A (gain less than one half of the maximum gain). By operating within these shaded areas or regions of FIGS. 3A and 3B, the effects of the input signal amplitude $e_{IN}$ on the bandwidth of the control loop are minimized. The lower the nominal gain, the lower the sensitivity to $e_{IN}$ will be. In practice, a 10 to 1 change of input amplitude will change the bandwidth less than 10%. In comparison, as those skilled in the art will recognize, it can be theoretically shown that for any input amplitude change, the maximum bandwidth change is two to one.

Figure 4:
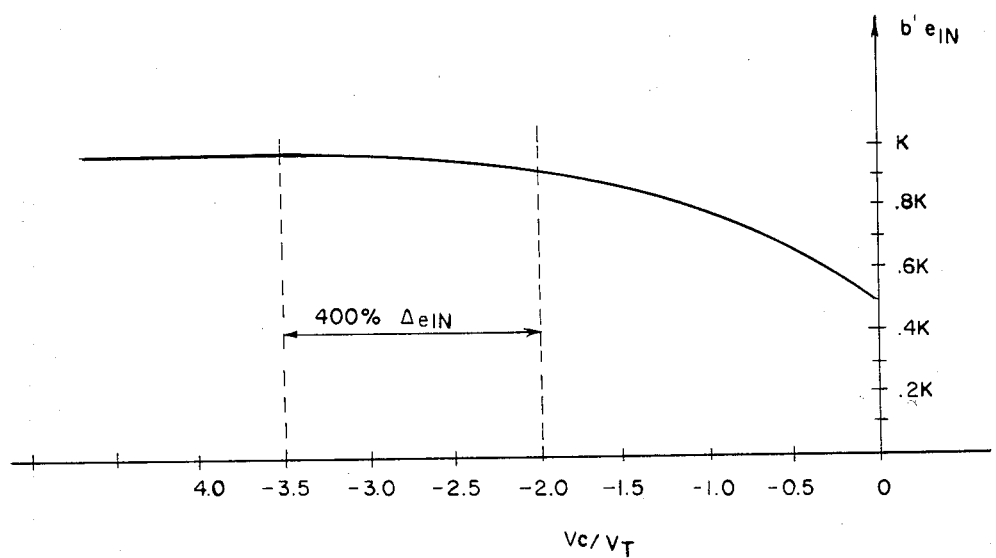
FIG. 4 is a plot showing how the product $(b') \times (e_{IN})$ varies as a function of the control voltage for the circuit shown in FIG. 2.

FIG. 4 is a plot that depicts the product $b'e_{IN}$ (which product is directly proportional to the bandwidth, see equation (14)) as a function of the ratio $v_c/V_T$. As indicated in FIG. 4, the bandwidth will be held relatively constant if the ratio of $v_c/V_T$ is kept large and negative. A value of $v_c/V_T$ that is large and negative corresponds to a high attenuation mode (small b). The curve shown in FIG. 4 is for a particular bias point where a 400% amplitude change in $e_{IN}$ only causes a 10% bandwidth change, rather than a 400% bandwidth change, as typically occurs in conventional AGC systems.

While the invention herein disclosed has been described by means of specific embodiments and applications thereof, numerous modifications and variations could be made thereto by those skilled in the art without departing from the spirit and scope of the present invention. It is therefore to be understood that within the scope of the appended claims, the invention may be practiced otherwise than as specifically described herein.

What is claimed is:

1. In an automatic gain control (AGC) system, a method of maintaining a relatively constant automatic gain control loop bandwidth that is independent of input signal level, said AGC loop comprising a variable gain element that relates an output signal, $e_{OUT}$, to an input signal, $e_{IN}$, as expressed by the relationship $e_{OUT} = b\, e_{IN}$, where b is the gain of said variable gain element, and further where the value of b has a maximum value of 1.0, which value is determined by a control signal, said control signal being a function of an error signal, and wherein said error signal is the difference between a reference signal and a feedback signal derived from said output signal $e_{OUT}$, said method comprising the steps of:
   (a) varying the value of b with said control signal, such that b changes inversely proportional to $e_{IN}$, whereby the product $be_{IN}$, and hence $e_{OUT}$, remains substantially constant; and
   (b) limiting the value of b to a value that is no more than 0.5.

2. The method as defined in claim 1 wherein the control signal that determines the value of the gain b is limited to a negative signal.

3. The method as defined in claim 1 wherein said variable gain element comprises a double balanced modulator circuit, the input of which is said input signal $e_{IN}$, and the output of which is coupled to a fixed gain video amplifier.

4. The method as defined in claim 3 wherein said variable gain element is characterized by having a first group of transistors and associated components that determine a bias current; a second group of transistors that modulate said bias current as a function of said input signal; and a third group of transistors capable of steering the modulated bias current, as a function of said control signal, either to ground at one extreme, in which case no output signal exists, or to a plurality of load resistors coupled to said third group of transistors, in which case a maximum output signal is developed across said load resistors, at the other extreme; and wherein the gain of said variable gain element is limited to less than 0.5 by limiting said control signal such that at least half of said modulated bias current is always steered to ground by said third group of transistors.

5. An automatic gain control system for generating a relatively constant output signal $e_{OUT}$ from a variable input signal $e_{IN}$, said system being characterized as having a substantially constant bandwidth regardless of the value of the input signal $e_{IN}$, said system comprising:
   a variable gain element that multiplies the input signal $e_{IN}$ by a variable gain factor b in order to generate said output signal $e_{OUT}$, $e_{OUT}$ thereby being defined as $e_{OUT} = be_{IN}$, said gain factor b having a maximum value of 1.0, the value of b being set by a control signal;
   means for generating said control signal from an error signal;
   means for generating said error signal as the difference between a reference signal and a feedback signal, said feedback signal being derived from said output signal $e_{OUT}$;
   means for controlling said control signal such that the value of said variable gain factor never exceeds 0.5 and such that the gain factor b varies inversely proportional to the input signal $e_{IN}$.

6. The constant bandwidth automatic gain control system of claim 5 wherein said variable gain element comprises:
   a balanced modulator circuit, including:
      means for generating a bias current,
      means for modulating said bias current with said input signal, and
      means responsive to said control signal for steering said modulated bias current to a load or to ground, as determined by the value of said control signal, whereby a first output signal may be generated by said modulated bias current flowing through said load; and
   means for amplifying and buffering said first output signal and converting it to said output signal $e_{OUT}$.

7. The constant bandwidth automatic gain control system of claim 6 wherein said control means for limiting the gain of said variable gain element to a value that never exceeds 0.5 comprises means for causing at least one-half of said modulated bias current to always be steered to ground.

8. A constant bandwidth automatic gain control system comprising:
   a variable gain element that multiplies an input signal by a variable gain factor in order to generate a system output signal, said variable gain factor assuming a value as determined by a control voltage;
   summation means for generating an error signal that is the difference between a reference signal and a feedback signal, said feedback signal being derived from said output signal;

integration means for generating said control voltage from said error signal, said control signal being coupled to said variable gain element; and means for limiting the gain factor of said variable gain element to a positive value that falls between zero and 0.5, and that varies inversely proportional to said input signal.

9. The constant bandwidth system of claim 8 wherein said variable gain element comprises a double balanced modulator integrated circuit having a first group of transistors that determine a bias current; a second group of transistors that modulate said bias current as a function of said input signal; and a third group of transistors that controllably direct said modulated bias current either to a load at one extreme, or to ground at the other extreme, in response to said control voltage, the voltage developed across said load comprising a first output signal from which said system output signal may be derived.

10. The constant bandwidth system as defined in claim 9 wherein said gain factor limiting means includes means for limiting said control voltage such that at least one half of said modulated bias current is always directed to ground, whereby the gain factor of said variable gain element never exceeds 0.5.

11. The constant bandwidth system as defined in claim 10 wherein said control voltage is limited to negative values with respect to ground.

* * * * *